(12) United States Patent
Byagowi et al.

(10) Patent No.: US 10,777,251 B1
(45) Date of Patent: Sep. 15, 2020

(54) IN-MEMORY PROCESSING BASED ON COMBINING OUTPUT CURRENTS

(71) Applicant: Facebook, Inc., Menlo Park, CA (US)

(72) Inventors: Ahmad Byagowi, Fremont, CA (US);
Aravind Kalaiah, Fremont, CA (US);
Mikhail Smelyanskiy, Burlingame, CA (US)

(73) Assignee: Facebook, Inc., Menlo Park, CA (US)

( * ) Notice: Subject to any disclaimer, the term of this patent is extended or adjusted under 35 U.S.C. 154(b) by 0 days.

(21) Appl. No.: 16/408,331

(22) Filed: May 9, 2019

(51) Int. Cl.
*G11C 11/24* (2006.01)
*G11C 11/405* (2006.01)
*G11C 11/404* (2006.01)
*H01L 27/108* (2006.01)

(52) U.S. Cl.
CPC ........ *G11C 11/405* (2013.01); *G11C 11/4045* (2013.01); *H01L 27/108* (2013.01)

(58) Field of Classification Search
CPC .. G11C 11/405; G11C 11/4045; H01L 27/108
USPC ....................................................... 365/149
See application file for complete search history.

(56) References Cited

U.S. PATENT DOCUMENTS

| 2014/0043897 A1* | 2/2014 | Pan | G11C 11/5642 |
| | | | 365/185.03 |
| 2017/0293437 A1* | 10/2017 | Lo | G11C 16/08 |

* cited by examiner

*Primary Examiner* — Vu A Le
(74) *Attorney, Agent, or Firm* — Van Pelt, Yi & James LLP

(57) ABSTRACT

A first value is stored in a first memory cell. A first component output current, from a first electronic component, is provided based on the stored first value, wherein the first component output current is proportional to a place value represented by the first value. A second value is stored in a second memory cell. A second component output current, from a second electronic component, is provided based on the stored second value, wherein the second component output current is proportional to a place value represented by the second value. A combined current of at least the first component output current and the second component output current is detected, wherein the combined current corresponds to a sum of at least the first value and the second value.

20 Claims, 9 Drawing Sheets

IN-MEMORY PROCESSING BASED ON COMBINING OUTPUT CURRENTS

BACKGROUND OF THE INVENTION

Computer memory, oftentimes referred to as main memory, primary storage, or simply memory, is computer hardware that stores information for immediate use in a computer. For example, random-access memory (RAM) is a type of computer memory implemented with semiconductor technology on integrated circuits that operates at a higher speed than secondary storage forms such as hard disk drives. Types of RAM include static random-access memory (SRAM) and dynamic random-access memory (DRAM). SRAM, oftentimes used as central processing unit (CPU) cache memory, is typically faster than DRAM but consumes more energy and offers lower memory area density than DRAM. RAM is usually organized as addressable arrays of memory cells, with each memory cell storing one bit (0 or 1) of information.

BRIEF DESCRIPTION OF THE DRAWINGS

Various embodiments of the invention are disclosed in the following detailed description and the accompanying drawings.

DETAILED DESCRIPTION

Figure 1:
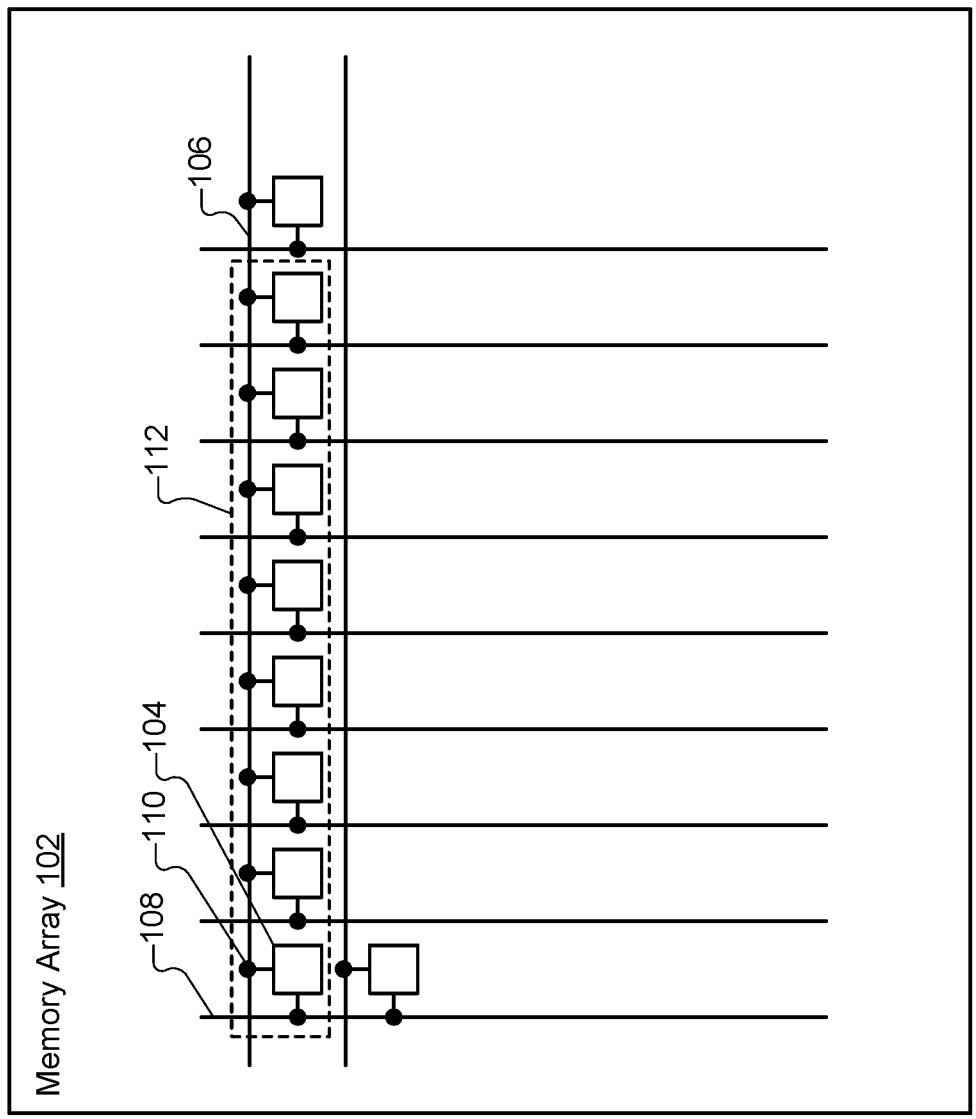
FIG. 1 is a diagram illustrating an embodiment of a memory array.

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Computer memory, which may also be referred to herein as main memory, primary storage, memory, etc., (e.g., RAM) has increasingly become a bottleneck for processing systems. Memory bandwidth, which is the rate at which data can be read from or stored into memory from a processor, has increasingly become a limiting factor for computation speed. Traditional approaches to increase memory bandwidth include increasing memory clock frequency, increasing data transfers per clock cycle, increasing memory bus width per memory interface, and increasing the number of memory interfaces from memory to a processor. However, these approaches have drawbacks (e.g., sometimes requiring commitment of significant resources to achieve better hardware performance). Thus, it would be beneficial from a computation speed perspective to develop approaches whereby computations may be performed within memory itself (without a processor), which would reduce and/or eliminate delays associated with a processor reading data from memory or storing data into memory.

A system for in-memory processing based on combining output currents is disclosed. The disclosed system comprises a first memory cell configured to store a first value, a first electronic component configured to provide a first component output current based on the stored first value (wherein the first component output current is proportional to a place value represented by the first value), a second memory cell configured to store a second value, a second electronic component configured to provide a second component output current based on the stored second value (wherein the second component output current is proportional to a place value represented by the second value), and a detector configured to detect a combined current of at least the first component output current and the second component output current (wherein the combined current corresponds to a sum of at least the first value and the second value). A practical and technological benefit of the invention disclosed herein is allowing for processing to be performed within memory, which allows for faster computation by reducing and/or eliminating time associated with transferring data from memory to a processor and/or from the processor to memory.

In some embodiments, in-memory processing is performed by summing output currents associated with individual memory cells in an integrated circuit memory array. In some embodiments, the memory array includes DRAM cells. Examples of DRAM types include asynchronous DRAM, synchronous DRAM (SDRAM), fast page mode DRAM (FPM DRAM), extended data out DRAM (EDO DRAM), burst EDO DRAM (BEDO DRAM), double data rate synchronous DRAM (DDR SDRAM), variants of the aforementioned DRAM types, etc. In various embodiments, the memory array includes cells laid out in a rectangular grid pattern in which individual cells are accessed by a corresponding grid of wordlines and bitlines. As described in further detail herein, in some embodiments, each cell is a DRAM cell comprising a capacitor and a transistor. A bit of data is stored as a presence or absence (corresponding to a 1 bit or 0 bit) of electric charge on the capacitor. The transistor may be used to access the capacitor for reading and writing of bit information. In various embodiments, sense amplifiers (e.g., cross-coupled inverter designs) periodically refresh electric charges on capacitors to prevent information loss due to depletion of capacitive charge and/or facilitate read/write operations by amplifying voltage differences associated with 1-bit or 0-bit capacitive states. As described in further detail herein, a DRAM cell design that includes a capacitor and three transistors may also be used.

In some embodiments, in-memory addition of values stored in a row of memory cells is performed. As described in further detail herein, this can be accomplished by using an analog summation approach. For example, a memory array in which each memory cell represents a bit may be arranged so that a collection of eight memory cells represents a byte, wherein each bit corresponds to a place value (e.g., a least significant bit corresponding to a $2^0$ place value, a next bit corresponding to a $2^1$ place value, and so forth up to a most significant bit corresponding to a $2^7$ place value). Thus, an eight-cell group storing bit values of 10110111 would correspond to a decimal value of $1*2^7+0*2^6+1*2^5+1*2^4 0*2^3+1*2^2+1*2^1+1*2^0=183$. In some embodiments, transistors in each cell of the eight-cell group are configured to provide output currents (e.g., in saturation mode) proportional to place values corresponding to individual cells in the eight-cell group. Stated alternatively, eight different transistor designs may be used, each corresponding to a different place value cell type. For example, a most significant bit cell may have a transistor that is configured to produce $2^7=128$ nanoamperes (nA) of current when storing a bit value of 1, a next most significant bit cell may have a transistor that is configured to produce $2^6=64$ nA when storing a bit value of 1, and so forth until a least significant bit cell, which may have a transistor that is configured to produce $2^{0=1}$ nA when storing a bit value of 1. Thus, an arrangement of eight cells with these transistor designs storing bit values of 10110111 would provide respective output currents of 128, 0, 32, 16, 0, 4, 2, and 1 nA.

Transistors may be configured to produce these varying output currents by manipulating transistor physical properties. For example, the saturation current for an n-channel metal-oxide-semiconductor field-effect transistor (NMOS) can be described using the following equation:

$$I_{DS} = \frac{1}{2}\mu_n C_{ox} \frac{W}{L}(V_{GS} - V_T)^2(1 + \lambda V_{DS}).$$

According to this equation, NMOS saturation current is proportional to channel width to length ratio (W/L). This physical property holds true for various other transistor types. Thus, transistor output current can be controlled by adjusting transistor dimensions, e.g., the W/L ratio (transistor output current increased by increasing width and/or decreasing length and transistor output current decreased by decreasing width and/or increasing length).

Returning to the example above, if the output currents of 128, 0, 32, 16, 0, 4, 2, and 1 nA are summed (e.g., wires carrying these output currents are joined in parallel), then the combined current would be 183 nA, corresponding to the decimal value of 183 represented by the bits stored in the eight-cell group described above. If the next eight cells in the row of memory cells (next byte) store bits 11010101, representing a decimal value of 213, then a combined current of 213 nA may be provided by those memory cells. If a combined current corresponding to a first byte (first eight cells) is summed with a combined current corresponding to a second byte (another eight cells), then a resulting current would correspond to the sum of the first byte and the second byte, which would be a computation (an addition operation) performed within memory. Summing the two groups of output currents above would provide a resulting current of 183 nA+213 nA=396 nA, corresponding to performing the calculation 183+213=396 in memory. In some embodiments, the resulting current is converted to a voltage by passing it through a precision resistor (e.g., a shunt resistor). In some embodiments, a calculation value (e.g., 396 in the current example) is expected to be outputted. As described in further detail herein, the calculation value may be outputted as a digital value by sending the resulting current (e.g., converted to a voltage) to a circuit comprising a successive approximation register (SAR) and a digital to analog converter (DAC). In some embodiments, whether the calculation value reaches a specified threshold value (not the actual calculation value itself) is expected to be outputted. As described in further detail herein, the calculation value may be compared to the specified threshold value by sending the resulting current (e.g., converted to a voltage) to a circuit comprising a comparator.

The above example is illustrative and not restrictive. As is readily apparent to a person skilled in the art, output currents do not need to start in the nanoampere range such that a $2^0$ bit results in a 1 nA current. Other arrangements in which output currents are proportional to place values they correspond to are possible. Furthermore, it is possible to perform computations on data units other than bytes (8-bit numbers). For example, addition of 16-bit numbers (e.g., short integers) is possible by designating a $2^{15}$ bit place value as a most significant bit. As shown above, a sum of numbers much larger than any individual number contributing to the sum can be represented because the sum is represented in analog form (e.g., a current). Stated alternatively, the sum is not restricted to the same dynamic range as any individual number contributing to the sum because the sum is represented as an analog signal. In some embodiments, each row and/or column of cells in a memory array is associated with processing circuitry (e.g., processing circuitry combining currents and/or detecting calculation values).

The disclosed invention may be used for various applications. For example, row summation (as described above and in further detail herein) may be used in inference calculations associated with machine learning applications. For example, an inference step of a machine learning computation may require multiplying an M×N matrix with an N×1 vector, resulting in an M×1 vector (e.g., Ax=b, where A is the M×N matrix, x is the N×1 vector, and b is the resulting M×1 vector). Each element of b is equal to a sum (dot product) associated with multiplying a row of A with the vector x. This sum may be calculated using summation of output currents (if a row in a memory array stores the numbers to be summed). In some embodiments, with respect to machine learning applications, only a determination as to whether each element of b exceeds a specified threshold is desired. For example, if b is a 10×1 vector in which each element corresponds to a probability that a numeric digit (0-9) has been recognized by a machine learning image recognition tool, then it may be sufficient to only determine whether each probability exceeds a specified threshold (e.g., corresponding to a specified confidence, such as 50%, 90%, 95%, etc., that a particular numeric digit has been recognized). A potential advantage of summation using output currents as described herein is that analog noise associated with the output currents may be desirable because noise is oftentimes intentionally added in machine learning applications for smoothing purposes. As another example, the disclosed invention may also be used to compute functions associated with non-deterministic polynomial-time (NP) hard problems.

FIG. 1 is a diagram illustrating an embodiment of a memory array. Memory array 102 includes a grid of memory cells, e.g. memory cell 104. In various embodiments, memory array 102 and each memory cell in memory array 102 (e.g., memory cell 104) is implemented on an integrated circuit (e.g., on a piece of silicon semiconductor substrate). In some embodiments, memory cell 104 is a DRAM cell. Examples of DRAM types include asynchronous DRAM, synchronous DRAM (SDRAM), fast page mode DRAM (FPM DRAM), extended data out DRAM (EDO DRAM), burst EDO DRAM (BEDO DRAM), double data rate synchronous DRAM (DDR SDRAM), variants of the aforementioned DRAM types, etc. It is also possible for memory cell 104 to be another memory type (e.g., SRAM). In some embodiments, memory cell 104 is accessed via wordline 106 and bitline 108. As shown in the example illustrated, each memory cell is connected to a wordline and a bitline. In FIG. 1 (and in subsequent figures), connection points are shown as solid dots, e.g. connection point 110 between memory cell 104 and wordline 106. In FIG. 1 (and in subsequent figures), unless otherwise specified, crossing lines without solid dots at intersection points are not connected (e.g., wordline 106 and bitline 108 do not physically touch in the example illustrated).

In the example shown in FIG. 1, a selection of memory cells is drawn for illustrative purposes. A memory array may include much larger numbers (not drawn in FIG. 1) of memory cells (e.g., thousands, tens of thousands, etc.). Grouping 112 is a grouping of eight memory cells. In some embodiments, a grouping of eight memory cells represents a byte of information (when a first memory cell in the grouping stores a $2^7$ place value most significant bit, a last memory cell in the grouping stores a $2^0$ place value least significant bit, and other memory cells store bits between the most significant bit and the least significant bit). For clarity of illustration purposes, supporting circuitry associated with memory array 102 (e.g., address buffer, row/column decoders, row/column buffers, sense amplifiers, input/output wiring, circuits associated with processing output currents to perform in-memory processing, etc.) are not shown. Such supporting circuitry is described in further detail herein.

Figure 2A:
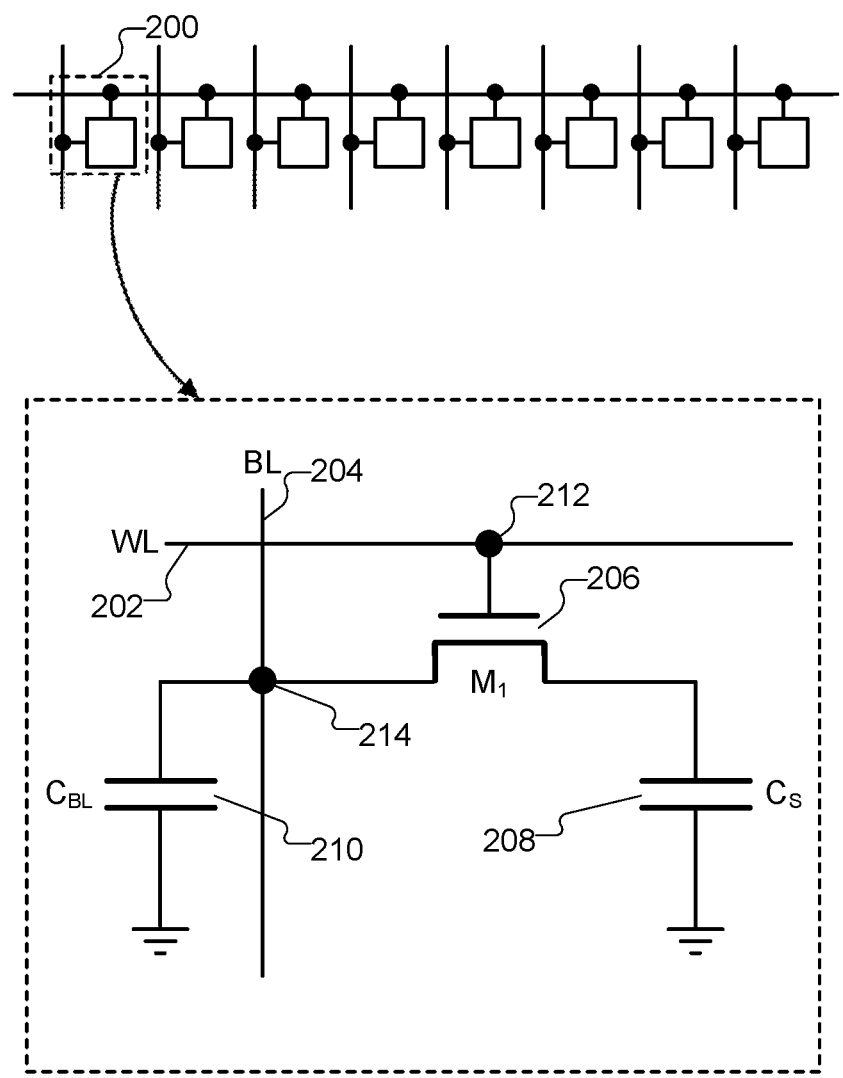
FIGS. 2A and 2B are diagrams illustrating embodiments of a memory cell.
Figure 2B:
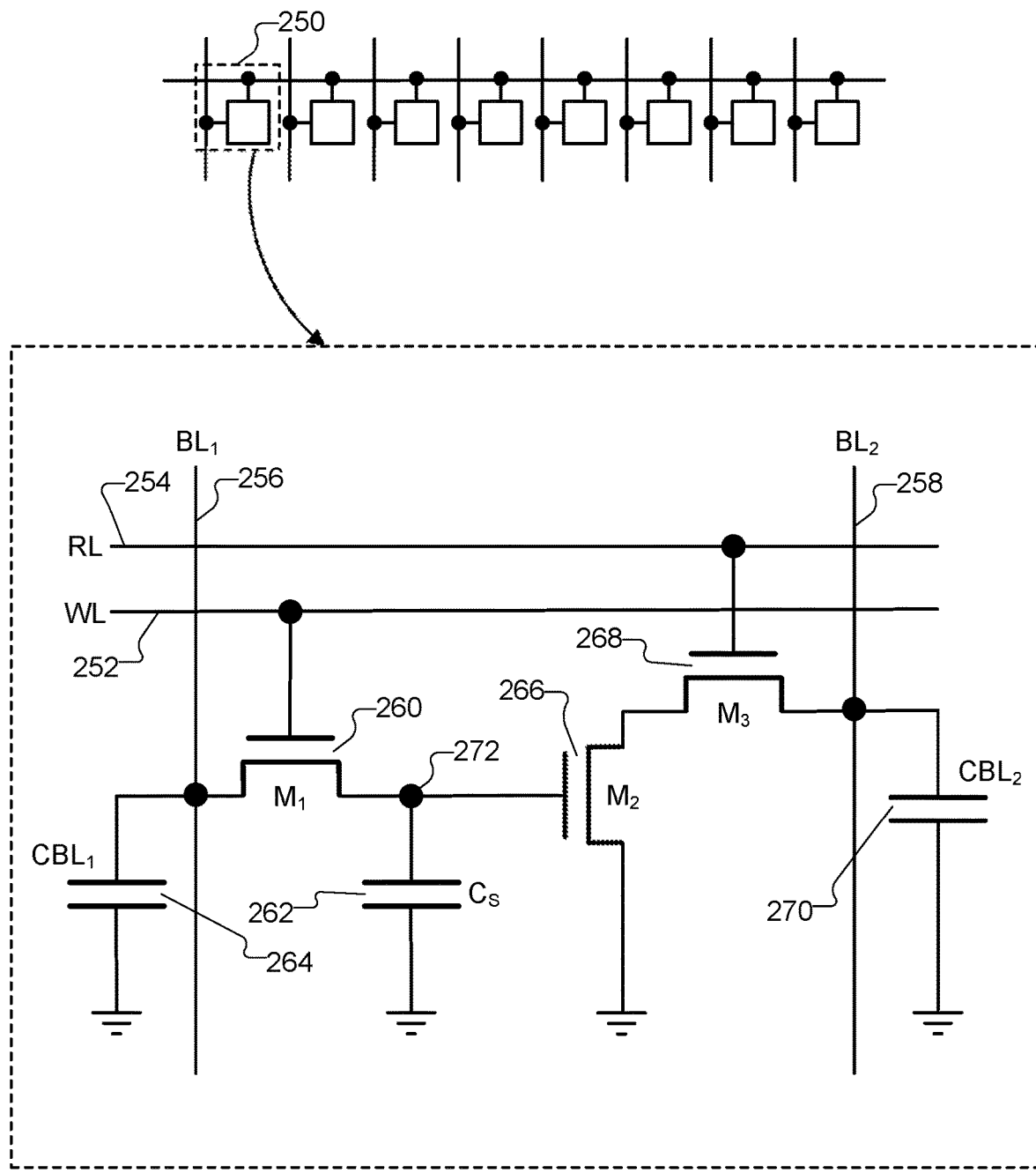

FIGS. 2A and 2B are diagrams illustrating embodiments of a memory cell. FIG. 2A illustrates a DRAM cell comprising a single transistor. FIG. 2B illustrates a DRAM cell comprising three transistors. FIG. 2A illustrates implementation details for memory cell 200. In various embodiments, memory cell 200 belongs to a memory array. For example, memory cell 200 may be a memory cell in memory array 102 of FIG. 1 (e.g., memory cell 104 of FIG. 1). The DRAM cell design of FIG. 2A includes a single transistor $M_1$ 206 connected to wordline 202, bit storage capacitor $C_S$ 208, bitline 204, and bitline capacitor $C_{BL}$ 210. Transistor $M_1$ 206 is connected to wordline 202 at connection point 212 and to bitline 204 and bitline capacitor $C_{BL}$ 210 at connection point 214. In some embodiments, wordline 202 corresponds to wordline 106 of FIG. 1 and bitline 204 corresponds to bitline 108 of FIG. 1.

During conventional operation in write mode of the type of DRAM cell shown in FIG. 2A, wordline 202 is set to a high voltage (e.g., a maximum voltage $V_{CC}$, activating a path from connection point 214 to bit storage capacitor $C_S$ 208). This allows bit storage capacitor $C_S$ 208 to either charge up (by receiving a high voltage set on bitline 204 and stored on bitline capacitor $C_{BL}$ 210) when a 1 bit is to be stored or discharge (with bitline 204 set to a low voltage) when a 0 bit is to be stored. During conventional operation in read mode, wordline 202 is also set to a high voltage, and bitline capacitor $C_{BL}$ 210 is pre-charged to an intermediate voltage (e.g., $V_{CC}/2$ if a 1 bit corresponds to a voltage of $V_{CC}$). A bit value is then read out on bitline 204 (e.g., according to the principle that the voltage at connection 214 will decrease if bit storage capacitor $C_S$ 208 is storing a 0 bit and will increase if bit storage capacitor $C_S$ 208 is storing a 1 bit). As will be described in further detail herein (e.g., see FIG. 3A), the current (e.g., saturation current) through transistor $M_1$ 206 may be configured to be based on the value stored in memory cell 200 and proportional to its place value. For clarity of illustration purposes, a connection of memory cell 200 to a sense amplifier (e.g., a cross-coupled inverter design) is not shown (also not shown in FIG. 2B). In some embodiments, a sense amplifier refreshes the electric charge on bit storage capacitor $C_S$ 208 after a read operation (due to the read operation being destructive) and amplifies voltage differentials to facilitate read and write operations.

As shown in FIG. 2B, another embodiment of a DRAM cell includes three transistors instead of one. FIG. 2B illustrates implementation details for memory cell 250. In various embodiments, memory cell 250 belongs to a memory array. For example, memory cell 250 may be a memory cell in memory array 102 of FIG. 1 (e.g., memory cell 104 of FIG. 1). The DRAM cell design of FIG. 2B includes a capacitor-transistor-capacitor combination (bitline1 capacitor $C_{BL1}$ 264, transistor $M_1$ 260, and bit storage capacitor $C_S$ 262) that is also included in the DRAM cell design of FIG. 2A (bitline capacitor $C_{BL}$ 210, transistor $M_1$ 206, and bit storage capacitor $C_S$ 208). Wordline 252 and bitline1 256 in FIG. 2B are analogous to wordline 202 and bitline 204, respectively, in FIG. 2A. Due to the similar structure, writing a bit to bit storage capacitor $C_S$ 262 in FIG. 2B occurs in the same manner as writing a bit to bit storage capacitor $C_S$ 208 in FIG. 2A (applying a high voltage to a transistor gate with a wordline so that a path from a bit storage capacitor to a bitline and bitline capacitor is activated; see discussion above with respect to FIG. 2A).

In the DRAM design shown in FIG. 2B, the addition of readline 254, bitline2 258, transistor $M_2$ 266, transistor $M_3$ 268, and bitline2 capacitor $C_{BL2}$ 270 allow for non-destructive reading of a stored bit (as opposed to destructive reading in the design of FIG. 2A). During read mode, readline 254 is set to a high voltage (and wordline 252 is set to a low voltage) to activate a path from bitline2 capacitor $C_{BL2}$ 270, which is pre-charged to a high voltage using bitline2 258 (e.g., pre-charged to $V_{CC}$), through transistor $M_3$ 268. Thus, whether an output current flows through transistor $M_2$ 266 and transistor $M_3$ 268 then depends on the voltage at connection point 272. If a 1 bit is stored, the voltage at connection point 272 will be high, which in turn activates transistor $M_2$ 266, producing a saturation output current. On the other hand, if a 0 bit is stored, the voltage at connection point 272 will be low, resulting in a deactivated transistor $M_2$ 266 and no saturation output current. As will be described in further detail herein (e.g., see FIG. 3A), the current (e.g., saturation current) through transistor $M_2$ 266 and/or transistor $M_3$ 268 may be configured to be proportional to the place value corresponding to memory cell 250.

Figures 3A, 3B:
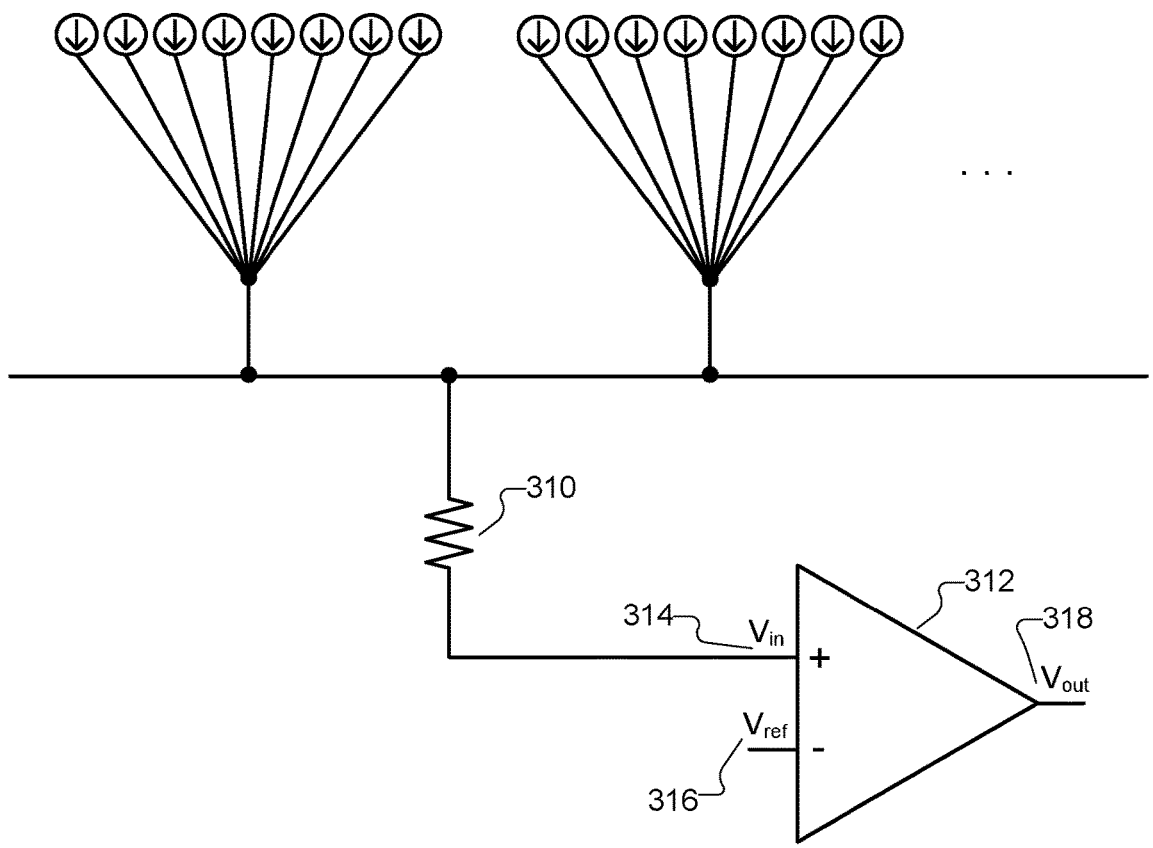
FIG. 3A is a diagram illustrating an example of memory cell output currents that are proportional to place values.
FIG. 3B is a diagram illustrating an example of detecting a combined current and comparing it to a threshold.

FIG. 3A is a diagram illustrating an example of memory cell output currents that are proportional to place values. In the example shown, 302 and 304 are groups of 8 memory cells in which each memory cell stores a bit. Because there are 8 bits in each group, the group collectively stores a byte of information. Groups 302 and 304 are part of a memory array (e.g., memory array 102 of FIG. 1). In various embodiments, each memory cell in 302 and 304 (e.g., having the design of memory cell 200 of FIG. 2A, memory cell 250 of FIG. 2B, etc.) is configured such that an electronic component of the memory cell is configured to provide a component output current proportional to the place value corresponding to the memory cell. With respect to the single transistor DRAM cell design of FIG. 2A, the electronic component whose output current is configured to be proportional to place value may be transistor $M_1$ 206. With respect to the three transistor DRAM cell design of FIG. 2B, the electronic component whose output current is configured to be proportional to place value may be transistor $M_2$ 266 or transistor $M_3$ 268 (it would also be possible to configure both to have output currents proportional to place value). These transistors may be implemented in various ways. Examples of transistor types include n-channel metal-oxide-semiconductor field-effect (NMOS), p-channel metal-oxide-semiconductor field-effect (PMOS), bipolar junction transistor (BJT), field-effect transistor (FET), junction gate field-effect transistor (JFET), etc.

In various embodiments, transistor output current (e.g., of transistor $M_1$ 206 of FIG. 2A and transistors $M_2$ 266 and $M_3$ 268 of FIG. 2B) is configured by adjusting transistor physical properties. For example, a saturation output current for an NMOS transistor may be adjusted by adjusting its channel width to length ratio (due to saturation output current being proportional to channel width to length ratio) as shown by the following equation for saturation output current of an NMOS transistor:

$$I_{DS} = \frac{1}{2}\mu_n C_{ox} \frac{W}{L}(V_{GS} - V_T)^2 (1 + \lambda V_{DS}).$$

Width to length ratio may be adjusted by adjusting width and/or length. Other properties may also be adjusted to adjust output current (e.g., adjusting electron mobility $\mu_n$ and oxide capacitance $C_{ox}$ according to the above NMOS saturation current equation).

In the example shown, output currents associated with each memory cell are configured to correspond to the memory cell's place value. In this example, the output currents range from $2^7$ current units (most significant bit) to $2^0$ current units (least significant bit). Examples of current units include nanoamperes, tens of nanoamperes, hundreds of nanoamperes, microamperes, etc. In various embodiments, the output current (in a specified current unit) associated with each memory cell is configured to equal the memory cell's place value if the memory cell stores a 1 bit and zero (no current) if the memory cell stores a 0 bit. As a concrete example, suppose group 302 stores bit values of 10110111 from most significant bit to least significant bit (corresponding to a decimal value of $1*2^7+0*2^6+1*2^5+1*2^4+0*2^3+1*2^2+1*2^1+1*2^{0=183}$). The output currents for group 302 (from most significant bit to least significant bit) would be 128, 0, 32, 16, 0, 4, 2, and 1 current units, which when combined would equal 183 current units. In some embodiments, these individual output currents may be combined by connecting in parallel the electronic components providing the output currents.

In the example shown, suppose group 304 stores bit values of 11010101 from most significant bit to least significant bit (corresponding to a decimal value of 213), resulting in a combined current of 213 current units. If the respective combined currents from group 302 and 304 are further combined (e.g., by joining in parallel wires carrying these currents), the resulting current would be 183+213=396 current units, which corresponds to the sum of the decimal values associated with groups 302 and 304. In various embodiments, a combined current for multiple memory cells (e.g., an entire row and/or column) is collected by reading currents from multiple transistors at a time (e.g., if the multiple transistors share common wiring and/or their output lines are combined). Thus, in-memory processing (e.g., summation) may be performed based on analog current summation. It is also possible to perform computations on data units other than bytes (8-bit numbers). For example, addition of 16-bit numbers (e.g., short integers) is possible by designating a $2^{15}$ bit place value as the most significant bit. A sum of numbers much larger than any individual number contributing to the sum can be represented appropriately because the sum is represented in analog form (e.g., a current), which is not restricted in dynamic range in the same manner that digital representations are.

FIG. 3B is a diagram illustrating an example of detecting a combined current and comparing it to a threshold. As shown in FIG. 3B, a combined current (combined from at least two groups of eight individual component output currents, such as groups 302 and 304 of FIG. 3A) is passed through resistor 310. In various embodiments, resistor 310 is a precision resistor (e.g., a shunt resistor) that converts the combined current into a detection voltage. In some embodiments, it is desirable to determine whether a value (e.g., decimal value) corresponding to the combined current reaches a specified threshold value. In the example shown, this is accomplished by supplying the detection voltage (as $V_{in}$ 314) to a first terminal of comparator 312 and a reference voltage (as $V_{ref}$ 316) to a second terminal of comparator 312. In some embodiments, $V_{ref}$ 316 is calibrated to equal a voltage given by multiplying a current corresponding to the specified threshold value and the resistance of resistor 310. In various embodiments, when $V_{in}$ 314 is greater than or equal to $V_{ref}$ 316, $V_{out}$ 318 will be a high voltage, indicating the specified threshold value has been reached. In various embodiments, when $V_{in}$ 314 is less than $V_{ref}$ 316, $V_{out}$ 318 will be a low voltage, indicating the specified threshold value has not been reached.

Figure 3C:
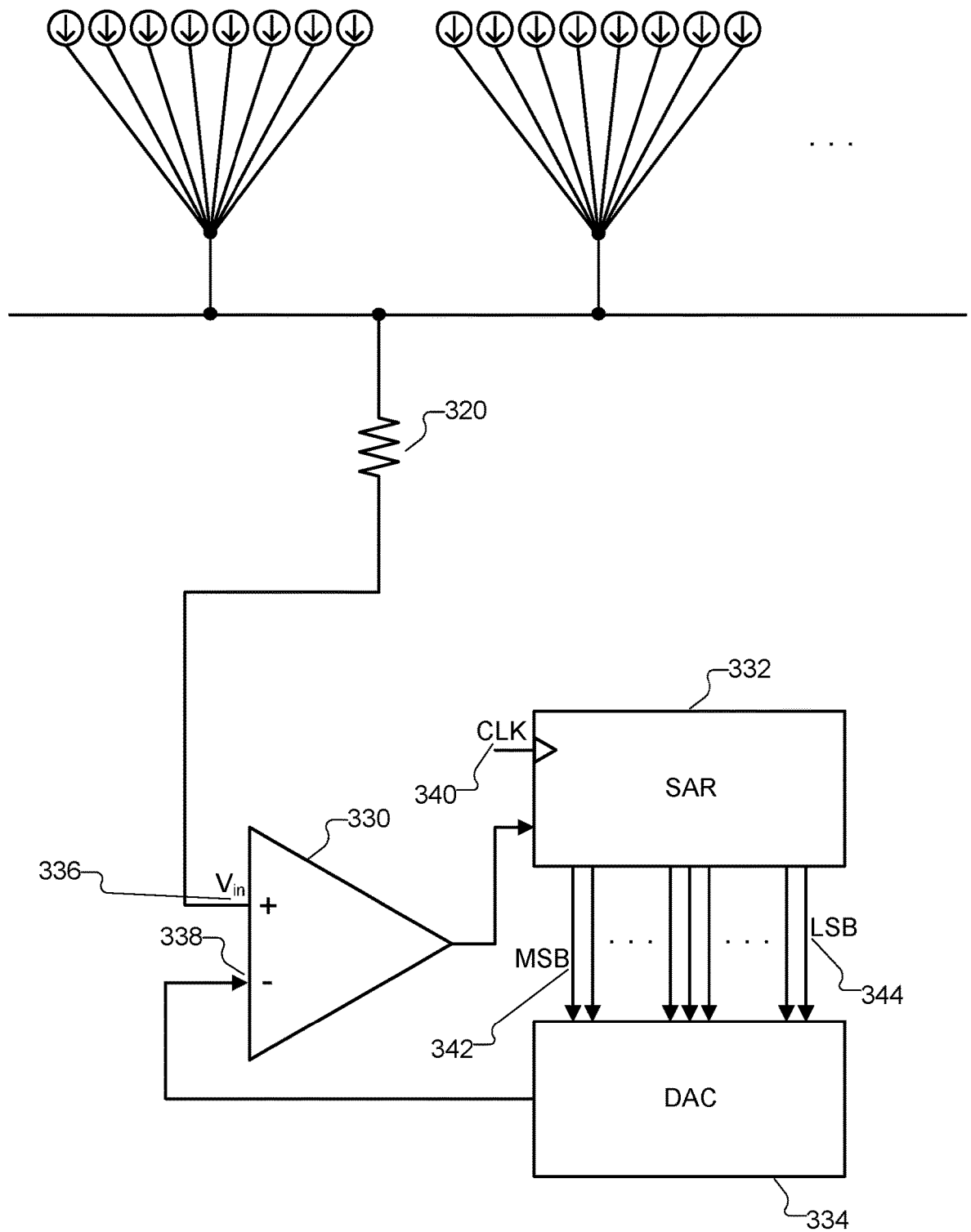
FIG. 3C is a diagram illustrating an example of detecting a combined current and determining a value corresponding to the combined current.

FIG. 3C is a diagram illustrating an example of detecting a combined current and determining a value corresponding to the combined current. In some embodiments, the value corresponding to the combined current is desired (e.g., value of 396 when adding 183 and 213 in the example of FIG. 3A). In the example shown, a combined current (combined from at least two groups of eight individual component output currents, such as groups 302 and 304 of FIG. 3A) is passed through resistor 320, producing a detection voltage $V_{in}$ 336 at a first terminal of comparator 330 (analogous to what is shown in FIG. 3B). In the example shown, the output of comparator 330 is sent to successive approximation register (SAR) 332. In various embodiments SAR 332 includes a register (comprising bits from a most significant bit to a least significant bit) configured to store a digital approximation to the value corresponding to $V_{in}$ 336. In various embodiments, initially, all of the bits in the register except for the most significant bit would be zero, and the register's bits would be sent to and received by digital to analog converter (DAC) 334 along bit lines 342 (most significant bit) through 344 (least significant bit). DAC 334 would then convert the received bits into an analog voltage 338 (calibrated to equal a voltage given by multiplying a current corresponding to the value of the received bits and the resistance of resistor 320) to be compared with $V_{in}$ 336. If the output of the comparison is positive, the most significant bit in the register would stay a 1 (otherwise, it would be set to 0). Then a next most significant bit would be set to 1 (with the most significant bit remaining whatever it was set to), creating an updated register of bits to be sent to and received by DAC 334 to determine the next most significant bit in the successive approximation. The process would continue for however many cycles (e.g., cycle period according to CLK 340) until the value corresponding to the combined current is converted to a digital approximation.

Figure 4:
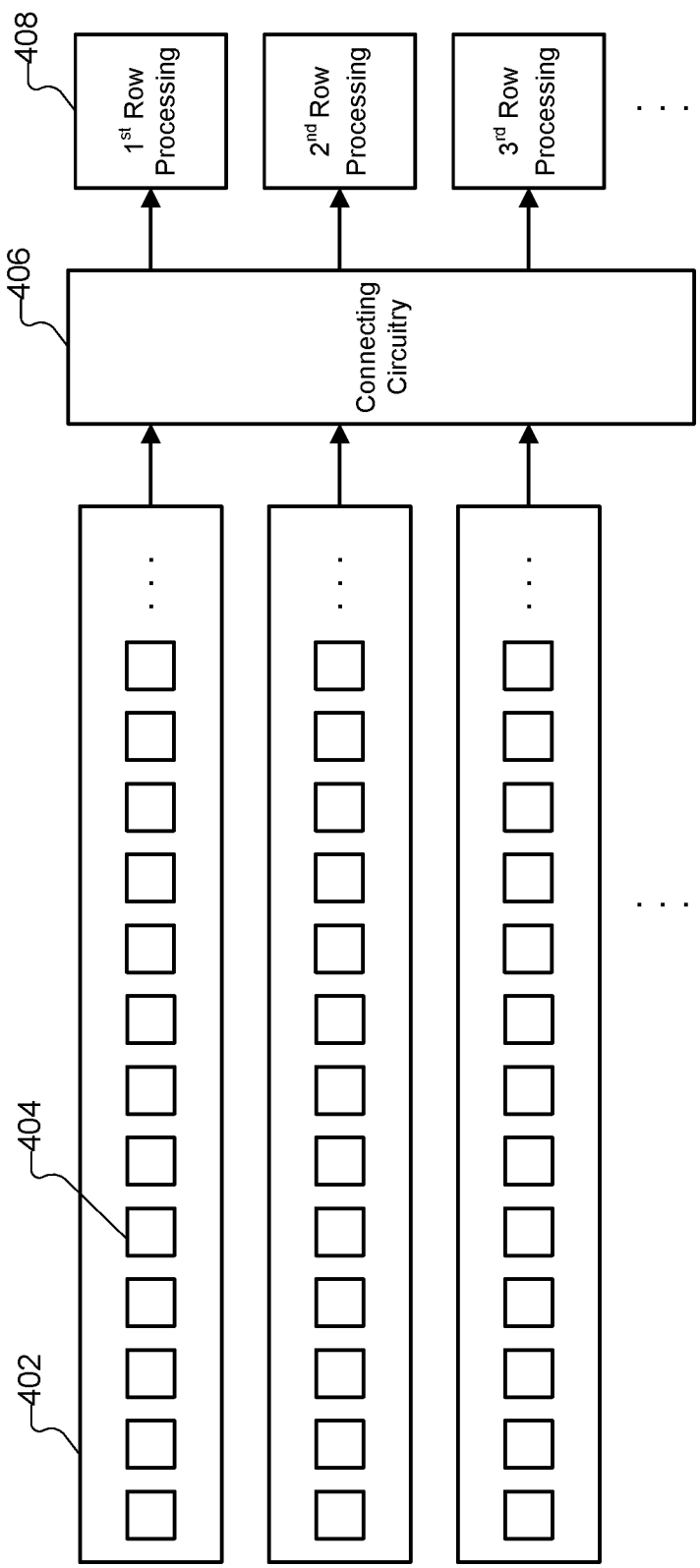
FIG. 4 is a diagram illustrating an embodiment of supporting circuitry associated with in-memory processing.

FIG. 4 is a diagram illustrating an embodiment of supporting circuitry associated with in-memory processing. In the example shown, 402 is a row of memory cells in a memory array (e.g., memory array 102 of FIG. 1). In the example shown, 404 is an individual memory cell in row 402. Examples of memory cells include memory cell 200 of FIG. 2A and memory cell 250 of FIG. 2B. In the example shown, connecting circuity 406 connects and/or routes signals associated with various memory cells, rows of memory cells, and/or columns of memory cells. In some embodiments, connecting circuitry 406 routes wires associated with output currents for memory cells in each row to processing circuitry for the row. For example, output currents in row 402 may be routed by connecting circuitry 406 to $1^{st}$ row processing 408. In some embodiments, $1^{st}$ row processing 408 includes the processing circuitry of FIG. 3B. In some embodiments, $1^{st}$ row processing 408 includes the processing circuitry of FIG. 3C. In some embodiments, an analogous arrangement is employed in which each column of memory cells (or each row and each column) is associated with processing circuitry. In some embodiments, connecting circuitry 406 is a multiplexer that forwards one or more signals to one or more processing blocks similar to 408. For example, connecting circuitry 406 may forward signals to a single processing block so that only one set of processing circuitry (e.g., processing circuitry of FIG. 3B or FIG. 3C) is required.

In some embodiments, the disclosed invention is used for computations associated with sparse neural networks. Many neural networks are organized as a biology-inspired stack of hierarchical layers. For example, an input layer, multiple hidden neuron layers, and an output layer may be present. Each of the multiple hidden neuron layers includes neurons that perform computations, wherein each neuron's computation involves outputting a weighted sum of inputs, with the inputs to the current layer being outputs from the preceding layer. This can be expressed in vector form as $a_{l+1} = f(W_l a_l)$, where $a_{l+1}$ is an output vector for a current layer, $a_l$ is a vector of inputs received from the preceding layer, W is a weight matrix, and f is a nonlinear function. In many instances, f is a squashing function, e.g., rectified linear unit (ReLU), that introduces nonlinearity to the neural network. Functions such as ReLU promote sparsity by, for example, zeroing out entries. Thus, significant sparsity may be associated with neural network computations (e.g., during inference). In some embodiments, the disclosed invention is used for computations associated with memory bandwidth bound processes, e.g., embedding table lookup. This can be described as $a_{l+1} = I^T(f_t(\Sigma_j(a_j^{j,t} + z_j^{j,t}) * s_j^{j,t}), \forall t \in [0,T))$, where $a_{l+1}$ is the output activation vector, $I^T$ is the interaction operation amongst the values reduced from T tables, $f_t$ is the non-linear operator defined for table t, $a_j^{j,t}$ is the (typically fixed point) embedded entry vectors looked up from table t at level l, $s_j^{j,t}$ is the (typically floating point) scaling factor, $z_j^{j,t}$ is the (typically fixed point) zero offset, and j is the index of the table entries that are looked up for a query.

In some embodiments, in association with neural network (e.g., sparse neural network) applications, the disclosed invention is used to perform computations in a parallel manner. In some embodiments, memory (e.g., memory cells of memory array 102 of FIG. 1) is partitioned into sub-memory modules. Operating on sub-memory modules in a parallel manner has the advantage of reducing computation time. Many memory array row addresses may be fed into memory with approximately one or no queries per sub-module of memory. For example, in various rows of memory shown in FIG. 4, values may be loaded in parallel, and addition of the values stored in each row may be performed independently of addition of the values stored in other rows. In various embodiments associated with sparse neural networks, portions of an overall inference computation are divided up, performed in parallel (e.g., out of order), and combined later. In many sparse neural networks, a divide and conquer approach may be beneficial because sparse regions can be omitted without accuracy loss. In some embodiments, data is loaded into memory sub-modules, computations on the data in the sub-modules are performed in parallel, the data from the sub-modules is retrieved, and the data is combined. For example, additional supporting circuitry 510 of FIG. 5 may be used to combine several rows of processed data from FIG. 4. Further processing may also be performed on the combined data with digital circuitry. In some embodiments, a pipeline process is employed to increase throughput (e.g., for large computations that impose challenging storage requirements). Loading values into memory, accessing the values, adding values in sub-modules of memory, outputting summed values, etc. may be steps in a pipeline process. In some embodiment, processing data from M sub-modules may be performed in N processors using parallel and distributed computing algorithms. Typically, one output vector is obtained from each sub-module per clock cycle. If multiple queries fall into the same sub-module, control logic may be used to pipeline such requests and carry that control logic forward to the input of the downstream N processors. Fetching of the vectors from the sub-modules can be combined with the refresh cycles of the sub-modules.

Figure 5:
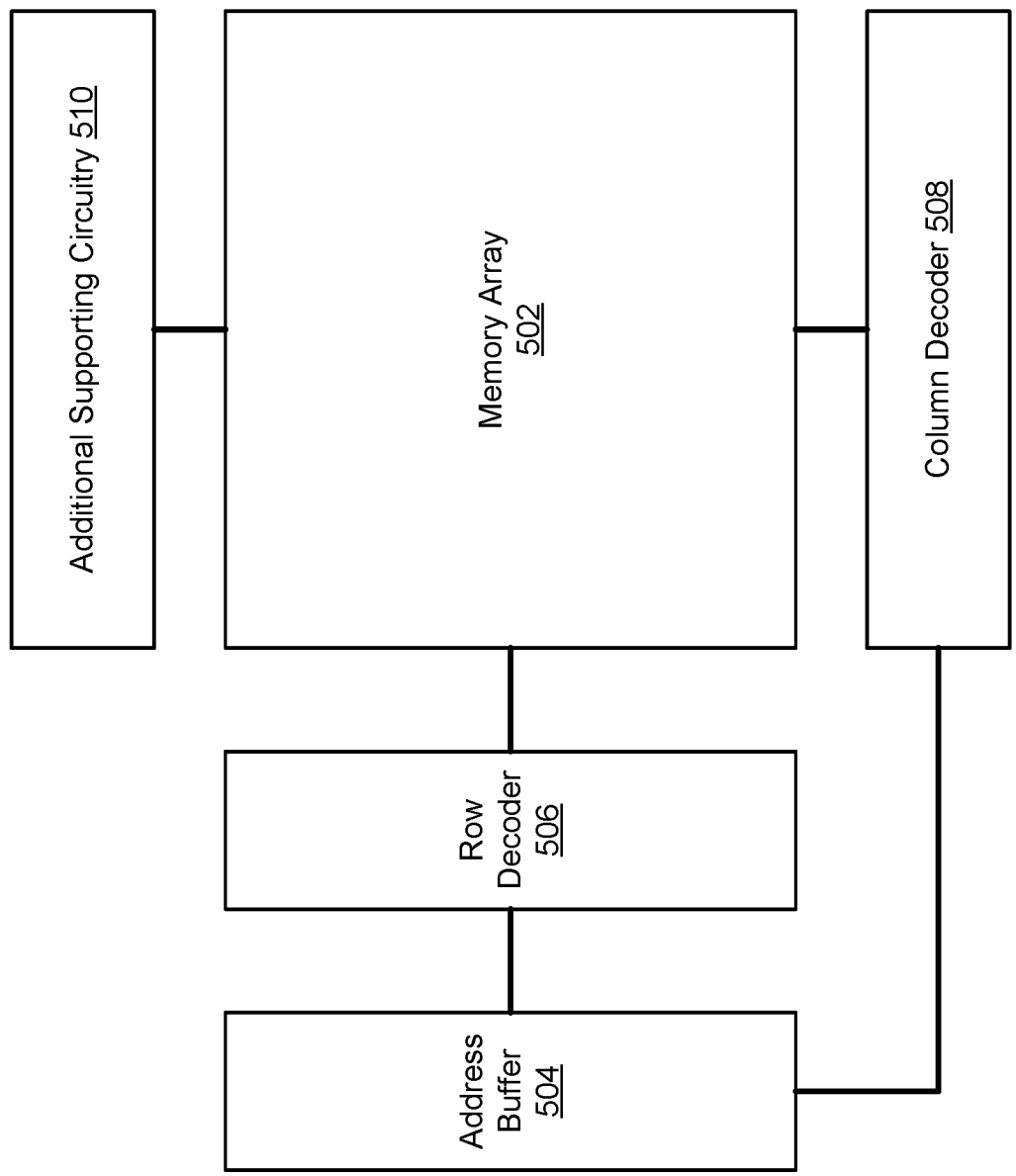
FIG. 5 is a diagram illustrating an embodiment of a memory array system.

FIG. 5 is a diagram illustrating an embodiment of a memory array system. In the example shown, memory array 502 is connected to row decoder 506, column decoder 508, and additional supporting circuitry 510. In some embodiments, memory array 502 is memory array 102 of FIG. 1. Row decoder 506 may include digital logic (e.g., AND, OR, NOT gates, etc.) that determines a row location of a memory cell based on an address stored in address buffer 504. Column decoder 508 may include digital logic (e.g., AND, OR, NOT gates, etc.) that determines a column location of a memory cell based on an address stored in address buffer 504. Address buffer 504 may also be implemented with digital logic (e.g., AND, OR, NOT gates, etc.). In some embodiments, additional supporting circuitry 510 includes a row and/or column buffer (e.g., implemented in digital logic) configured to hold an entire row and/or column of information, respectively, of memory array data, after a single read operation. In some embodiments, additional supporting circuitry 510 includes one or more sense amplifiers and/or input/output wiring. In some embodiments, additional supporting circuitry 510 includes electronic component output current detection circuitry and/or other circuitry for in-memory processing (e.g., processing circuitry of FIGS. 3B and 3C and processing block 408 of FIG. 4).

Figure 6:
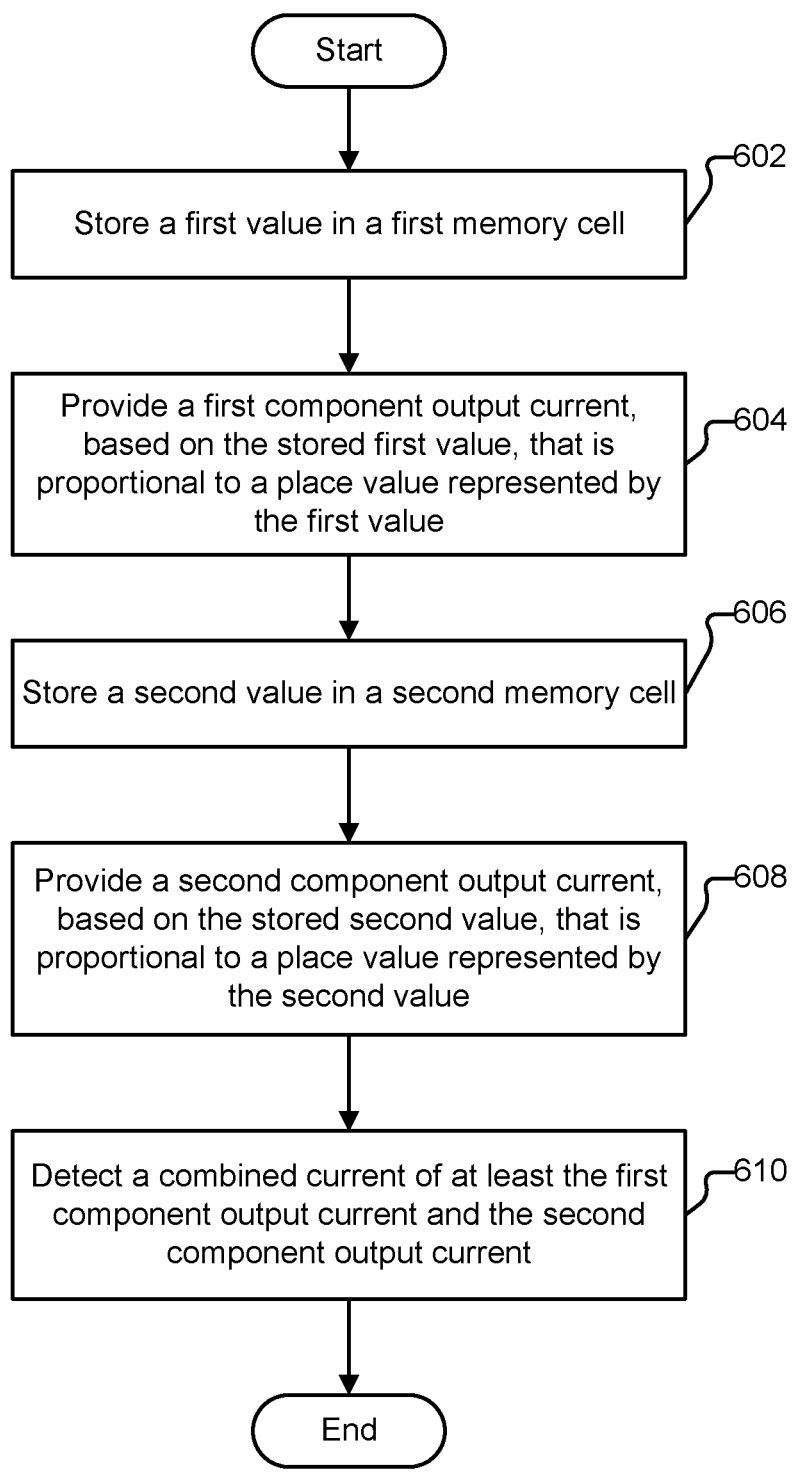
FIG. 6 is a flow chart illustrating an embodiment of a process for performing in-memory processing.

FIG. 6 is a flow chart illustrating an embodiment of a process for performing in-memory processing. In some embodiments, at least a portion of this process is performed by memory array 102 of FIG. 1 or memory array 502 of FIG. 5.

At 602, a first value is stored in a first memory cell. In some embodiments, the first value is a 1 bit or a 0 bit. In some embodiments, the first memory cell is a memory cell from memory array 102 of FIG. 1. In some embodiments, the first memory cell is a single transistor DRAM cell (e.g., memory cell 200 of FIG. 2A). In some embodiments, the first memory cell is a three transistor DRAM cell (e.g., memory cell 250 of FIG. 2B).

At 604, a first component output current, based on the stored first value, that is proportional to a place value represented by the first value is provided. In various embodiments the first component output current is provided by an electronic component (e.g., transistor $M_1$ 206 of FIG. 2A, transistor $M_2$ 266 of FIG. 2B, or transistor $M_3$ 268 of FIG. 2B). In various embodiments, the first component output current is proportional to a bit place value. For example, if the first memory cell is in a $2^3$ place value position and stores a 1 bit, the first component output current may be $2^3$ current units. If a 0 bit were stored, the first component output current would be zero current units.

At 606, a second value is stored in a second memory cell. In some embodiments, the second memory cell is a memory cell from memory array 102 of FIG. 1. In some embodiments, the second memory cell is a single transistor DRAM cell (e.g., memory cell 200 of FIG. 2A). In some embodiments, the second memory cell is a three transistor DRAM cell (e.g., memory cell 250 of FIG. 2B).

At 608, a second component output current, based on the stored second value, that is proportional to a place value represented by the second value is provided. In various embodiments the second component output current is provided by an electronic component (e.g., transistor $M_1$ 206 of FIG. 2A, transistor $M_2$ 266 of FIG. 2B, or transistor $M_3$ 268 of FIG. 2B). In various embodiments, the second component output current is proportional to a bit place value. For example, if the second memory cell is in a $2^4$ place value position and stores a 1 bit, the second component output current may be $2^4$ current units. If a 0 bit were stored, the second component output current would be zero current units.

At 610, a combined current of at least the first component output current and the second component output current is detected. In various embodiments, the combined current corresponds to a sum of at least the first value and the second value. For example, if the first value is $2^3=8$ and the second value is $2^4=16$, the combined current of $8+16=24$ current units corresponds to the sum of the first value and the second value. Stated alternatively, in some embodiments, the combined current corresponds to an addition operation acting on at least the first value and the second value. In some embodiments, the combined current is converted to a voltage via a precision resistor (e.g., a shunt resistor), after which the voltage is detected. In some embodiments, the voltage is compared to a reference voltage corresponding to a specified threshold value (e.g., using comparator 312 of FIG. 3B). In this manner, it may be determined whether a value corresponding to the combined current reaches the specified threshold value. In some embodiments, the voltage is converted to a digital value corresponding to the sum of at least the first value and the second value (e.g., using the circuit combination comprising comparator 330, SAR 332, and DAC 334 of FIG. 3C). In this manner, an actual value of the sum of at least the first value and the second value may be determined.

Figure 7:
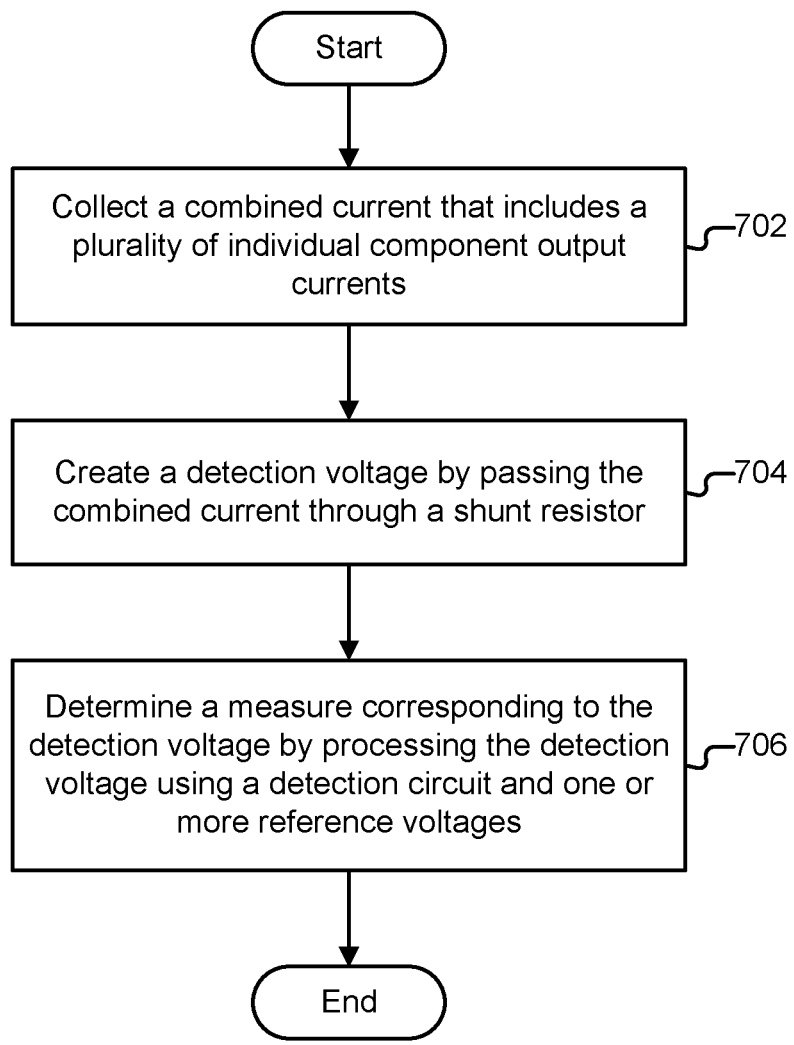
FIG. 7 is a flow chart illustrating an embodiment of a process for detecting a combined current.

FIG. 7 is a flow chart illustrating an embodiment of a process for detecting a combined current. In some embodiments, at least a portion of this process is performed by processing block 408 of FIG. 4 or additional supporting circuitry 510 of FIG. 5. In some embodiments, at least a portion of the process of FIG. 7 is performed in 610 of FIG. 6.

At 702, a combined current that includes a plurality of individual component output currents is collected. In some embodiments, the plurality of individual component output currents is combined by joining them in parallel (e.g., by connecting wires). In some embodiments, the plurality of individual component output currents is associated with groups of memory cells (e.g., groups 302 and 304 in FIG. 3A). In some embodiments, the plurality of individual component output currents are currents from transistors (e.g., transistor $M_1$ 206 of FIG. 2A, transistor $M_2$ 266 of FIG. 2B, and transistor $M_3$ 268 of FIG. 2B).

At 704, a detection voltage is created by passing the combined current through a shunt resistor. In various embodiments, the combined current is not measured directly. It may be converted to the detection voltage by passing it through a resistor according to Ohm's law (i.e., voltage=current×resistance). In some embodiments, the shunt resistor is an integrated circuit resistor (e.g., diffused, epitaxial, pinched, and thin film).

At 706, a measure corresponding to the detection voltage is determined by processing the detection voltage using a detection circuit and one or more reference voltages. An example of a detection circuit is the comparator circuit of FIG. 3B for threshold detection. In this circuit, the detection voltage may be supplied to a first terminal of a comparator and a reference voltage supplied to a second terminal of the comparator to determine whether the detection voltage is greater than or equal to the reference voltage. The reference voltage would be calibrated to equal a voltage given by multiplying a current corresponding to a specified threshold value and the resistance of the shunt resistor. The threshold value and/or reference voltage may be provided from a register, memory, a DAC, or other source. Another example of a detection circuit is the comparator-SAR-DAC circuit of FIG. 3C for analog to digital conversion. As described with respect to FIG. 3C, this detection circuit converts an analog signal (the combined current) into a digital value via successive approximation over several approximation cycles, determining the digital value one bit per cycle (using multiple reference voltages generated by a DAC). An analog to analog successive approximation may also be performed by performing successive approximations with reference values that have been successively halved (circuit not shown).

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A system, comprising:
a first memory cell configured to store a first value;
a first electronic component configured to provide a first component output current based on the stored first value, wherein the first component output current is proportional to a place value represented by the first value;
a second memory cell configured to store a second value;
a second electronic component configured to provide a second component output current based on the stored second value, wherein the second component output current is proportional to a place value represented by the second value; and
a detector configured to detect a combined current of at least the first component output current and the second component output current, wherein the combined current corresponds to a sum of at least the first value and the second value; and
wherein at least one of the first memory cell or the second memory cell includes a transistor and a capacitor.

2. The system of claim 1, wherein at least one of the first memory cell or the second memory cell is a dynamic random-access memory (DRAM) cell.

3. The system of claim 1, wherein at least one of the first memory cell or the second memory cell includes at least three transistors and a capacitor.

4. The system of claim 1, wherein at least one of the first electronic component or the second electronic component is a transistor.

5. The system of claim 1, wherein at least one of the first component output current or the second component output current is a negative-channel metal oxide semiconductor (NMOS) saturation current or a positive-channel metal oxide semiconductor (PMOS) saturation current.

6. The system of claim 1, wherein the first electronic component and the second electronic component are transistors having different dimensions.

7. The system of claim 1, wherein the first electronic component and the second electronic component are members of a set of different electronic component types included in the system, wherein each electronic component type of the set of different electronic component types is associated with a corresponding different place value.

8. The system of claim 1, wherein the detector is further configured to compare the sum of at least the first value and the second value to a specified threshold value.

9. The system of claim 1, wherein the detector is further configured to determine a digital approximation to the sum of at least the first value and the second value.

10. The system of claim 1, wherein the detector includes a resistor through which the combined current flows.

11. The system of claim 10, wherein the detector includes a comparator.

12. The system of claim 10, wherein the detector includes a comparator, a successive approximation register, and a digital to analog converter.

13. The system of claim 1, wherein the combined current includes contributions from a plurality of groups of component output currents, wherein each group of component output currents is associated with at least a byte of information.

14. The system of claim 1, wherein the first memory cell and the second memory cell are located in a same row or column of a memory array.

15. The system of claim 1, wherein the first memory cell and the second memory cell are located in one of a plurality of sub-modules of a memory array, wherein outputs of the plurality of sub-modules are processed in parallel.

16. The system of claim 1, wherein the first memory cell and the second memory cell are located in a memory array in which each memory cell of the memory array is individually addressable.

17. The system of claim 1, wherein the first value and the second value are associated with a vector computation of a sparse neural network.

18. The system of claim 1, wherein the first memory cell and the second memory cell are located in a memory array that is a part of a memory array system that includes an address buffer, a row decoder, and a column decoder.

19. A method, comprising:
storing a first value in a first memory cell;
providing a first component output current, from a first electronic component, based on the stored first value, wherein the first component output current is proportional to a place value represented by the first value;
storing a second value in a second memory cell;
providing a second component output current, from a second electronic component, based on the stored second value, wherein the second component output current is proportional to a place value represented by the second value; and
detecting a combined current of at least the first component output current and the second component output current, wherein the combined current corresponds to a sum of at least the first value and the second value; and
wherein at least one of the first memory cell or the second memory cell includes a transistor and a capacitor.

20. A system, comprising:
a first memory cell configured to store a first value;
a first electronic component configured to provide a first component output current based on the stored first value, wherein the first component output current is proportional to a place value represented by the first value;
a second memory cell configured to store a second value;
a second electronic component configured to provide a second component output current based on the stored second value, wherein the second component output current is proportional to a place value represented by the second value; and
a detector configured to detect a combined current of at least the first component output current and the second component output current, wherein the combined current corresponds to a sum of at least the first value and the second value; and
wherein the detector includes a resistor through which the combined current flows.

* * * * *